(12) United States Patent
Xu et al.

(10) Patent No.: US 9,318,629 B2
(45) Date of Patent: Apr. 19, 2016

(54) METHOD FOR FABRICATING SENSOR USING MULTIPLE PATTERNING PROCESSES

(71) Applicant: BEIJING BOE OPTOELECTRONICS TECHNOLOGY CO., LTD., Beijing (CN)

(72) Inventors: Shaoying Xu, Beijing (CN); Zhenyu Xie, Beijing (CN); Xu Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/125,444

(22) PCT Filed: Nov. 23, 2012

(86) PCT No.: PCT/CN2012/085189
§ 371 (c)(1),
(2) Date: Dec. 11, 2013

(87) PCT Pub. No.: WO2014/015593
PCT Pub. Date: Jan. 30, 2014

(65) Prior Publication Data
US 2015/0008435 A1 Jan. 8, 2015

(30) Foreign Application Priority Data
Jul. 26, 2012 (CN) .......................... 2012 1 0262565

(51) Int. Cl.
*H01L 31/18* (2006.01)
*H01L 31/0352* (2006.01)
(Continued)

(52) U.S. Cl.
CPC .......... *H01L 31/0352* (2013.01); *H01L 23/481* (2013.01); *H01L 27/1461* (2013.01);
(Continued)

(58) Field of Classification Search
CPC .............. H01L 33/00; H01L 31/02325; H01L 31/1884; H01L 31/1888
USPC ................... 257/59, 66, 361, 461; 438/69, 98
See application file for complete search history.

(56) References Cited

U.S. PATENT DOCUMENTS 7,250,991 B2 * 7/2007 Nagata et al. .................... 349/38
7,750,422 B2 * 7/2010 Watanabe et al. ............. 257/431
(Continued)

FOREIGN PATENT DOCUMENTS

CN 101529593 A 9/2009
CN 101567378 A 10/2009
(Continued)

OTHER PUBLICATIONS

International Search Report mailed Feb. 5, 2013; PCT/CN2012/085189.
(Continued)

*Primary Examiner* — Thanh V Pham
(74) *Attorney, Agent, or Firm* — Ladas & Parry LLP

(57) ABSTRACT

Embodiments of the invention disclose a sensor and its fabrication method, the sensor comprises: a base substrate, a group of gate lines and a group of data lines arranged as crossing each other, a plurality of sensing elements arranged in an array and defined by the group of gate lines and the group of data lines, each sensing element comprising a TFT device and a photodiode sensing device, wherein the TFT device is a bottom gate TFT; the photodiode sensing device comprises: a receiving electrode connected with a source electrode, a photodiode disposed on the receiving electrode, a transparent electrode disposed on the photodiode, and a bias line disposed on and connected with the transparent electrode, the bias line is disposed as parallel to the gate line.

13 Claims, 5 Drawing Sheets

(51) Int. Cl.
*H01L 27/146* (2006.01)
*H01L 23/48* (2006.01)
*H01L 31/0232* (2014.01)

(52) U.S. Cl.
CPC .... *H01L27/14692* (2013.01); *H01L 31/02325* (2013.01); *H01L 31/18* (2013.01); *H01L 2924/0002* (2013.01)

(56) References Cited

U.S. PATENT DOCUMENTS

| | | | |
|---|---|---|---|
| 2006/0001120 A1* | 1/2006 | Wright | 257/452 |
| 2008/0067324 A1 | 3/2008 | Heiler et al. | |
| 2008/0164473 A1* | 7/2008 | Tai et al. | 257/59 |
| 2009/0026509 A1* | 1/2009 | Hayashi et al. | 257/292 |
| 2009/0057564 A1* | 3/2009 | Miyayama et al. | 250/370.09 |
| 2009/0152563 A1* | 6/2009 | Hayashi et al. | 257/72 |
| 2009/0251653 A1* | 10/2009 | Hayashi | 349/139 |
| 2009/0267121 A1 | 10/2009 | Ishida et al. | |
| 2010/0237250 A1* | 9/2010 | Hayashi | 250/361 R |
| 2011/0127534 A1 | 6/2011 | Weisfield et al. | |
| 2012/0160318 A1* | 6/2012 | Baik | 136/256 |

FOREIGN PATENT DOCUMENTS

| | | |
|---|---|---|
| CN | 101728334 A | 6/2010 |
| CN | 101807549 A | 8/2010 |
| CN | 102790063 A | 11/2012 |

OTHER PUBLICATIONS

First Chinese Office Action dated Jun. 5, 2014; Appln. No. 201210262565.8.
International Preliminary Report on Patentability dated Jan. 27, 2015; PCT/CN2012/085189.
Second Chinese Office Action dated Feb. 9, 2015; Appln. No. 201210262565.8.
Third Chinese Office Action dated Aug. 31, 2015; Appln. No. 201210262565.8.

* cited by examiner

A-A'

B-B'

A-A'

B-B'

A-A'

METHOD FOR FABRICATING SENSOR USING MULTIPLE PATTERNING PROCESSES

FIELD OF THE ART

Embodiments of the invention relate to a sensor and a method for fabricating the same.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is sensor.

FIG. 1 illustrates a basic configuration of a sensor. The sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected with a corresponding scan line 15 of the sensor 12, the drain of the FET 14 is connected with a corresponding data line 16 of the sensor 12, and the source of the FET 14 is connected to the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal is controlled by controlling the ON/OFF state of the FET 14.

Currently, sensors generally employ a thin film transistor (TFT) plate configuration. Such a sensor may have many layers in its cross section. For example, each sensing element comprises a substrate, a gate electrode layer, a gate insulating layer, an active layer, a source electrode and a drain electrode layer, a passivation layer, PIN junction of the PIN photosensor, a transparent electrode window layer, and a bias line layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of masking, developing, exposure, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

The invention aims to provide a sensor and its fabrication method so as to overcome the technical problems of sensors having high production cost and complicated fabrication processes and difficulty in improving the production capacity.

A first aspect of the invention provides a sensor, comprising: a base substrate, a group of gate lines and a group of data lines arranged as crossing each other, a plurality of sensing elements arranged in an array and defined by the group of gate lines and the group of data lines, each sensing element comprising a Thin Film Transistor (TFT) device and a photodiode sensing device, wherein:

the TFT device comprises: a gate electrode disposed on the base substrate and connected with a neighboring gate line; a gate insulating layer disposed on the gate electrode and overlaying the base substrate; an active layer disposed on the gate insulating layer and over the gate electrode; the ohmic layer disposed on the active layer; a source electrode and a drain electrode disposed on the ohmic layer and arranged opposed to each other to form a channel, wherein the drain electrode is connected with a neighboring data line; and a passivation protective layer disposed on the source electrode, the drain electrode and the channel;

the photodiode sensing device comprises: a receiving electrode connected with the source electrode; a photodiode disposed on the receiving electrode; a transparent electrode disposed on the photodiode; and a bias line disposed over the transparent electrode and connected with the transparent electrode, the bias line is disposed as parallel to the gate line.

A second aspect of the invention provides a method for fabricating a sensor comprising:

forming a pattern of a gate line and a pattern of a gate electrode connected with the gate line on a base substrate by using a first patterning process;

forming a gate insulating layer overlaying the base substrate, and forming a pattern of an active layer on the gate insulating layer and over the gate electrode, a pattern of an ohmic layer on the active layer, a pattern of a source electrode and a drain electrode on the ohmic layer and arranged opposed to each other to form a channel, a pattern of a data line connected with the drain electrode, and a pattern of a receive electrode connected with the source electrode;

forming a pattern of a passivation protective layer on the source electrode, the drain electrode and the channel by using a second patterning process;

forming a pattern of a photodiode on the receiving electrode and a pattern of a transparent electrode on the photodiode by using a third patterning process;

forming a pattern of a first passivation layer by using a fourth patterning process, the first passivation layer has a via hole over the transparent electrode;

forming a pattern of a bias line on the first passivation layer and connected with the transparent electrode through the via hole over the transparent electrode, and a pattern of a light-shield strip on the source electrode, the drain electrode and the channel by using a fifth patterning process.

The TFT sensing device of the sensor in accordance with the embodiment of the invention is a bottom gate TFT, the sensor is fabricated through less number of the patterning processes. In comparison with the conventional technologies, the method for fabricating the sensor in accordance with the invention reduces the number of used masks and the production cost, and improves the production capacity and defect-free rate of the products.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
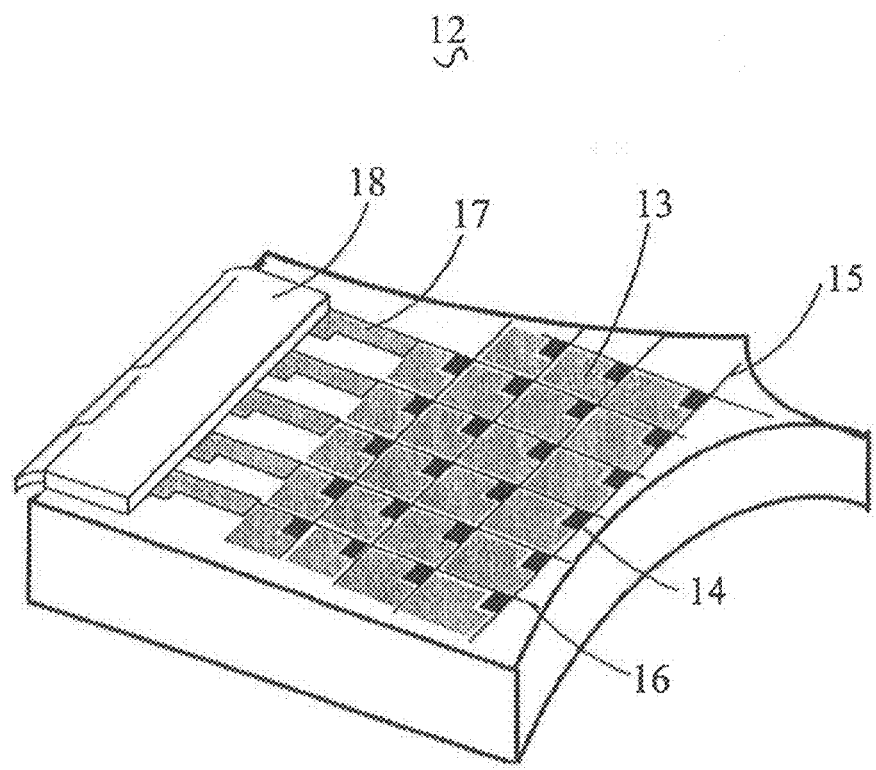
FIG. 1 schematically illustrates a three-dimensional (3-D) configuration of a conventional sensor.

12: sensor; 13: photodiode; 14: FET
15: scan line 16: data line 17: connecting pin
18: data readout circuit 30: gate line 31: data line
32: base substrate 33: source electrode 34: drain electrode
35: ohmic layer 36: active layer 37: gate insulating layer
38: gate electrode 39: receive electrode 40: photodiode
41: transparent electrode 57: second passivation layer 40a: N-type semiconductor
40b: I-type semiconductor 40c: P-type semiconductor 43: first passivation layer
42: bias line 52: light-shield strip 53: passivation protective layer
55: active material layer 56: ohmic material layer

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may be an X-ray sensor or other type of sensors, such as a sensor for transmitting signals via photo-electric conversion. The following descriptions and drawings are for a single sensing element while other sensing elements may be formed in the same way.

Embodiments of the invention provide a sensor and its fabrication method to address the technical problems of sensors having high cost and complicated fabrication processes in the conventional art.

Figure 2:
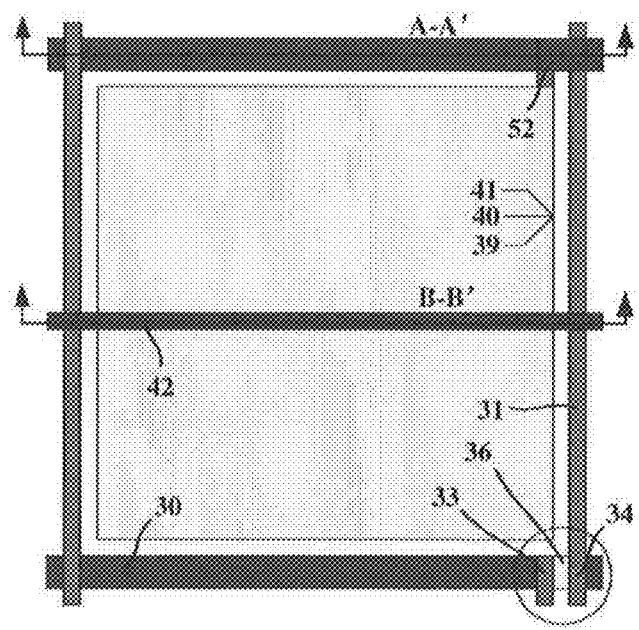
FIG. 2 is a top view of a sensing element of a sensor in accordance with an embodiment of the invention.
Figure 15:
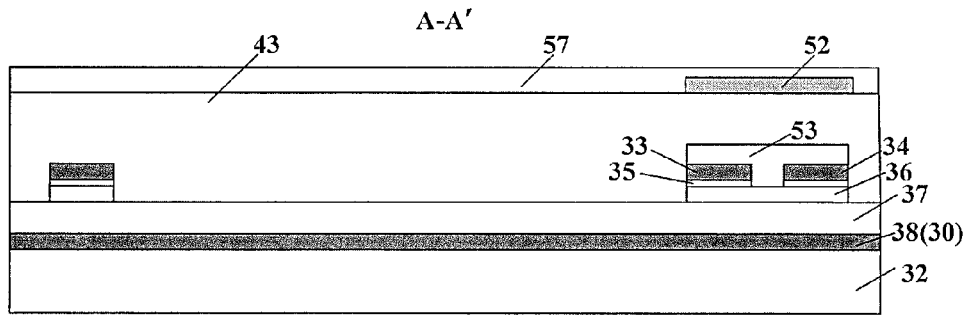
FIG. 15 is a cross section taken along the line A-A' of FIG. 2 after the seventh patterning process for the sensing element in accordance with an embodiment of the invention.
Figure 16:
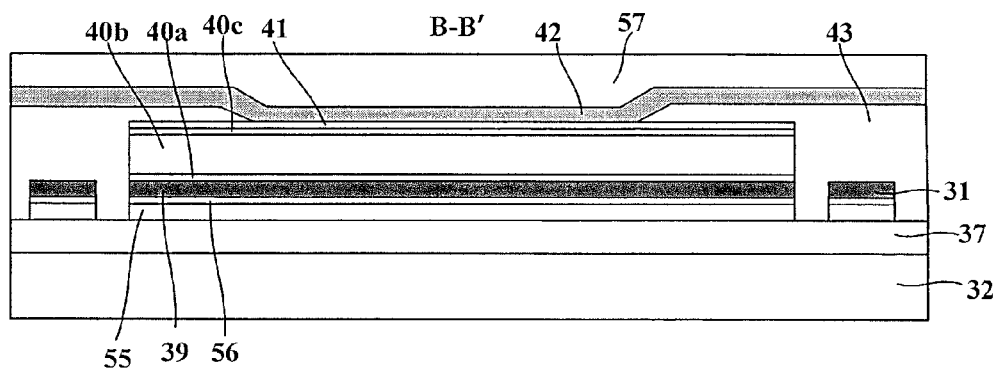
FIG. 16 is a cross section taken along the line B-B' of FIG. 2 after the seventh patterning process for the sensing element in accordance with an embodiment of the invention.

FIG. 2 is a top view of a sensing element of a sensor in accordance with an embodiment of the invention. FIGS. 15 and 16 are cross section views of the sensing element along the lines A-A' and B-B' of FIG. 2, respectively. As illustrated in FIGS. 2, 15 and 16, the sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device, in which:

The TFT device comprises: a gate electrode 38 disposed on the base substrate 32 and connected with an adjacent gate line 30; a gate insulating layer 37 disposed on the gate electrode 38 and overlying the base substrate; an active layer 36 disposed on the gate insulating layer 37 and over the gate electrode 38; an ohmic layer 35 disposed on the active layer 36; a source electrode 33 and a drain electrode 34 disposed on the ohmic layer 35 and arranged opposed to each other to form a channel, the drain electrode 34 is connected with the neighboring data line 31; and a passivation protective layer 53 disposed on the source electrode 33, the drain electrode 34 and the channel;

The photodiode sensor device comprises: a receiving electrode 39 connected with the source electrode 33, a photodiode (PD) 40 disposed on the receiving electrode 39, a transparent electrode 41 disposed on the PD 40 and a bias line 42 disposed on the transparent electrode 41 and connected with the transparent electrode 41, where the bias line 42 is arranged as parallel to the gate line 30.

In an embodiment of the invention, the base substrate 32 may be a glass substrate, a plastic substrate or a substrate made of other materials; the gate line 30, the gate electrode 38, the date line 31, the source electrode 33, the drain electrode 34, the receiving electrode 39, the bias line 42 and a light-shield strip 52 (the strip 52 is used for reducing the effect of the light on the channel) described below may be of the same material such as a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm.

In the embodiment of the invention, a material of the ohmic layer 35 may be for example a doped semiconductor (n+a-Si); a material of the active layer 36 may be a semiconducting material, such as, amorphous silicon (a-Si), with a thickness of 30 nm to 250 nm; a material of the gate insulating layer 37 may be silicon nitrides with a thickness of 300 nm to 500 nm; a material of the passivation protective layer 53 may be silicon nitrides or resin and so on, with a thickness of 150 nm to 400 nm, the passivation protective layer 53 may be of the same material to a first passivation layer 43 and a second passivation layer 57 described below. After the TFT device is formed, when the photodiode and the transparent electrode are formed by etching, the passivation layer can protect the channel effectively from being damaged by etching. A material of the transparent electrode 41 may be transparent conductive materials such as indium tin oxides (ITO) or indium zinc oxides (IZO).

In the embodiment of the invention, the photodiode is a PIN photodiode, comprising: an N-type semiconductor (n+a-Si) 40a disposed on the receiving electrode 39, an I-type semiconductor (a-Si) 40b disposed on the N-type semiconductor 40a, and a P-type semiconductor (p+a-Si) 40c disposed on the I-type semiconductor 40c. A PIN photodiode has the advantages of having small junction capacitance, short transit time and high sensitivity and is therefore a preferred choice. In other embodiments of the invention, the photodiode may be a MIS (Metal-Insulator-Semiconductor)-type photodiode and the like.

Figure 12:
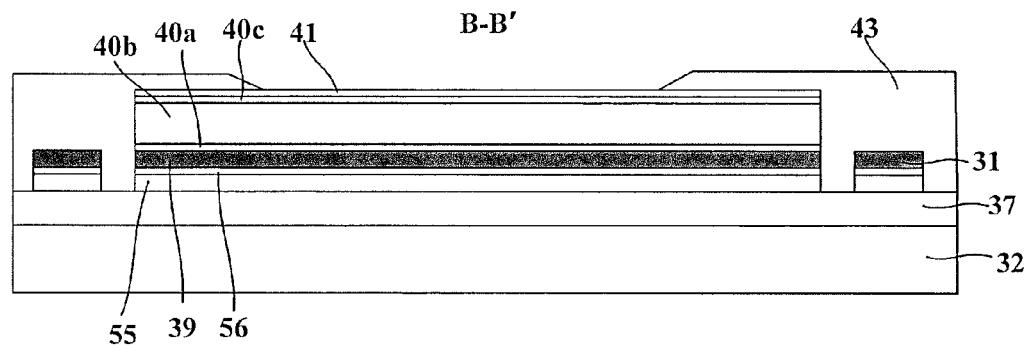
FIG. 12 is a cross section taken along the line B-B' of FIG. 2 after the fifth patterning process for the sensing element in accordance with an embodiment of the invention.

Still referring to FIGS. 15 and 16, the sensor may further comprises:

the active material layer 55 and the ohmic material layer 56 disposed on the gate insulating layer 37 sequentially and under every data line 31 as well as the receive electrode 39 of every photodiode sensor device;

the first passivation layer 43 disposed on the passivation protective layer 53 and the transparent electrode 41 and overlaying the base substrate, the first passivation layer 43 has a via hole 43H (as shown in FIG. 12) over the transparent electrode 41 for connecting the transparent electrode 41 and the bias line 42;

a light-shield strip 52 disposed on the first passivation layer 43 and over the source electrode 33, the drain electrode 34 and the channel;

the second passivation layer 57 disposed on the light-shield strip 52 and overlaying the base substrate, the second passivation layer 57 has a signal-transmitting region via hole (FIGS. 15 and 16 illustrate a cross section of a sensing element, therefore, the signal-transmitting region via hole at the peripheral of the base substrate is not shown).

In an embodiment, the data line 31, the source electrode 33, the drain electrode 34 and the receive electrode 39 are of the same material; the light-shield strip 52 and the bias line 42 are of the same material; the active material layer 55 and the ohmic material layer 56 are of the same material as the active layer 36 and the ohmic layer 35, respectively. The purpose of designing this structure is to reduce the number of patterning process, the active material layer 55 and the ohmic material layer 56 in the sensor does not play a practical role. The first passivation layer 43 (as well as a second passivation layer 57) may be made of an inorganic insulating film (such as silicon nitrides) or an organic insulating film (such as a photosensitive resin material or a non-photosensitive resin) with a thickness of, for example, 1000 nm to 2000 nm.

In an embodiment of the invention, the TFT device of the sensor is a bottom gate TFT and the sensor is fabricated through seven or eight patterning processes, which reduces the number of masks used in the fabrication and the production cost, in comparison with conventional production processes, simplifies the production process and improves the production capacity and defect-free rate of the products.

In accordance with an embodiment of the invention, a method for fabricating the above sensor comprises:

Step 101: a patterning process is used to form, on the base substrate 32, a pattern of the gate line 30, a pattern of the gate electrode 38 connected with the gate line 30. A cross section after the first patterning process is illustrated in FIGS. 3 and 4.

Figure 3:
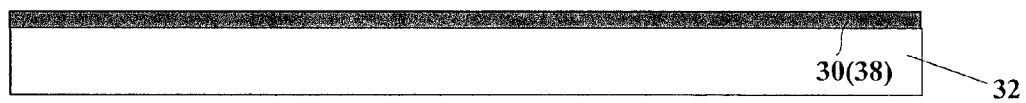
FIG. 3 is a cross section taken along the line A-A' of FIG. 2 after the first patterning process for the sensing element in accordance with an embodiment of the invention.
Figure 4:
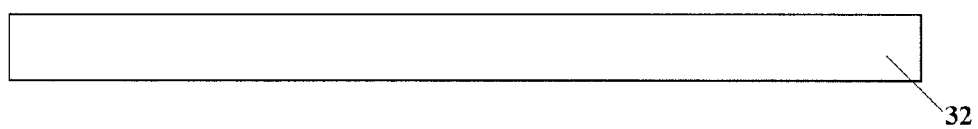
FIG. 4 is a cross section taken along the line B-B' of FIG. 2 after the first patterning process for the sensing element in accordance with an embodiment of the invention.

FIGS. 3 and 4 illustrate the cross section of the base substrate after the first patterning process. FIGS. 2, 15 and 16 are respectively the top view and the cross sections of the sensing element finally obtained after seven processes. Therefore, the base substrate as illustrated in FIGS. 3 and 4 is only a cross section taken along the lines A-A' and B-B' of FIG. 2 and does not represent real cross section of the base substrate of FIG. 2. Similarly, FIGS. 5 to 14, 17 and 18 are illustrated in the same way.

A patterning process sequentially comprises steps of substrate cleaning, film forming, photoresist application, exposure, developing, etching, photoresist removal and so on. The substrate may be cleaned using de-ionized water or an organic cleanser. The film forming process is to form the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern. Patterning processes in the following steps are the same and will not be described.

Figure 5:
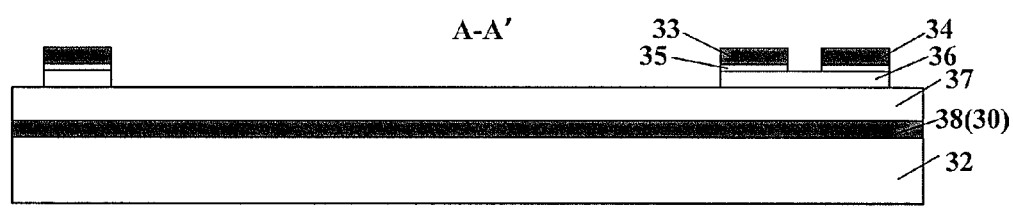
FIG. 5 is a cross section taken along the line A-A' of FIG. 2 after the second patterning process for the sensing element in accordance with an embodiment of the invention.
Figure 6:
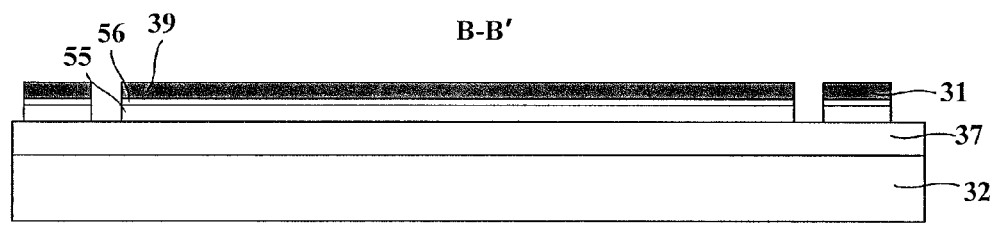
FIG. 6 is a cross section taken along the line B-B' of FIG. 2 after the second patterning process for the sensing element in accordance with an embodiment of the invention.

Step 102: forming a gate insulating layer 37 overlaying the base substrate, and forming a pattern of the active layer 36 on the gate insulating layer 37 and over the gate electrode 38, a pattern of the ohmic layer 35 on the active layer 36, a pattern of the source electrode 33 and the drain electrode 34 on the ohmic layer 35 and arranged opposed to each other to form a channel, a pattern of a data line 31 connected with the drain electrode 34 and a pattern of the receive electrode 39 connected with the source electrode 33. A cross section after the second patterning process is illustrated in FIGS. 5 and 6. In the step, the active material layer 55 and the ohmic material layer 56 are formed at the same time.

Figure 7:
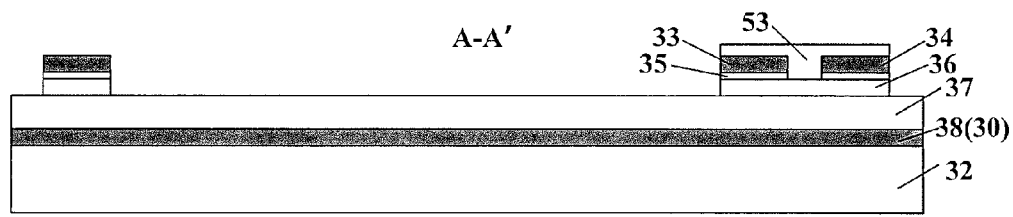
FIG. 7 is a cross section taken along the line A-A' of FIG. 2 after the third patterning process for the sensing element in accordance with an embodiment of the invention.
Figure 8:
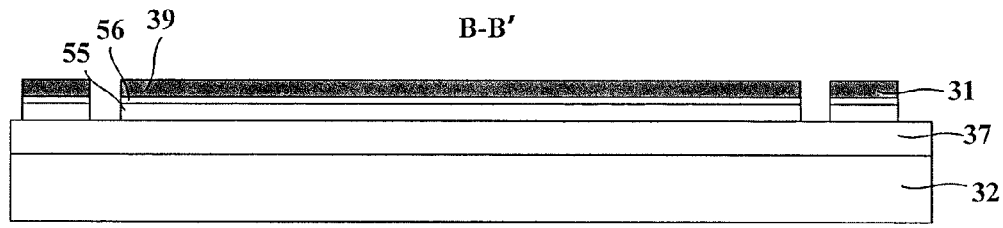
FIG. 8 is a cross section taken along the line B-B' of FIG. 2 after the third patterning process for the sensing element in accordance with an embodiment of the invention.

Step 103: a patterning process is used to form a pattern of the passivation protective layer 53 on the source electrode 33, the drain electrode 34 and the channel. A cross section after the third patterning process is illustrated in FIGS. 7 and 8. The purpose of setting the passivation protective layer 53 is to protect the channel of the TFT device from being damaged by etching in step 104.

Figure 9:
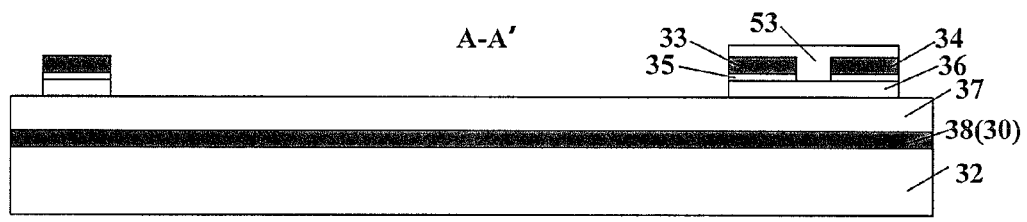
FIG. 9 is a cross section taken along the line A-A' of FIG. 2 after the fourth patterning process for the sensing element in accordance with an embodiment of the invention.
Figure 10:
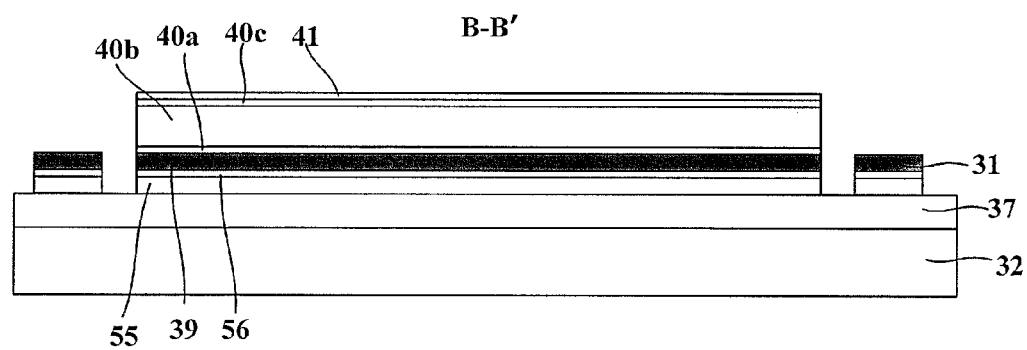
FIG. 10 is a cross section taken along the line B-B' of FIG. 2 after the fourth patterning process for the sensing element in accordance with an embodiment of the invention.

Step 104: a patterning process is used to form a pattern of the photodiode 40 (40a, 40b, 40c) on the receive electrode 39 and a pattern of the transparent electrode 41 on the photodiode 40 (40a. 40b, 40c). A cross section after the forth patterning process is illustrated in FIGS. 9 and 10.

In an example, the step 104 may comprises:

Depositing the N-type semiconductor, the I-type semiconductor, the P-type semiconductor and the transparent electrode layer sequentially, and forming a pattern of the photodiode 40 and the transparent electrode 41 by using a patterning process; in the patterning process, the pattern of the transparent electrode 41 can be formed using wet etching single, and also can be formed using dry etching together with the photodiode 40.

Figure 11:
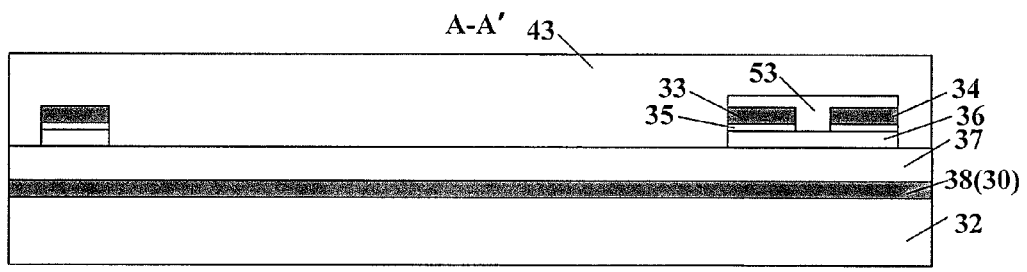
FIG. 11 is a cross section taken along the line A-A' of FIG. 2 after the fifth patterning process for the sensing element in accordance with an embodiment of the invention.

Step 105: a patterning process is used to form a pattern of the first passivation layer 43 which has a via hole 43H over the transparent electrode 41 to expose part of the transparent electrode 41; such that the bias line 42 to be formed in the next step may connect with the transparent electrode 41 through the via hole 43H. A cross section after the fifth patterning process is illustrated in FIGS. 11 and 12.

Figure 13:
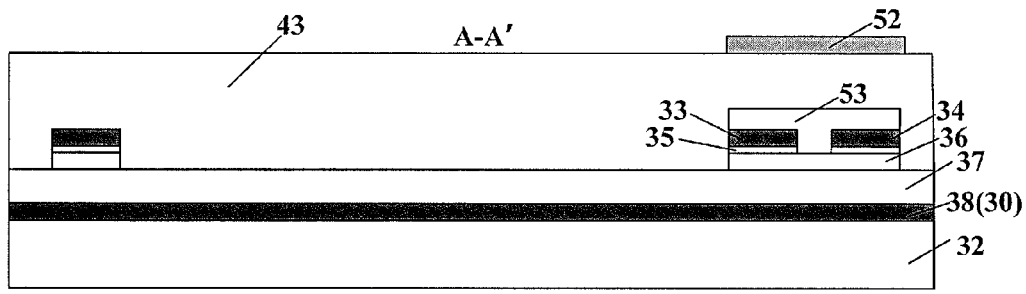
FIG. 13 is a cross section taken along the line A-A' of FIG. 2 after the sixth patterning process for the sensing element in accordance with an embodiment of the invention.
Figure 14:
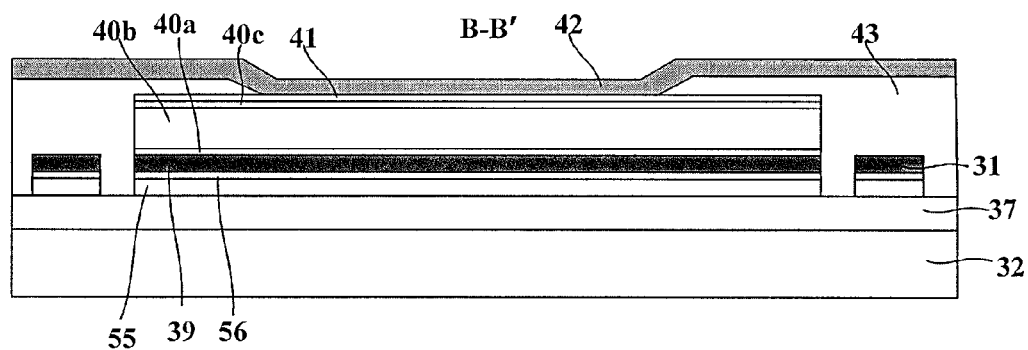
FIG. 14 is a cross section taken along the line B-B' of FIG. 2 after the sixth patterning process for the sensing element in accordance with an embodiment of the invention.

Step 106: a patterning process is used to form a pattern of the bias line 42 disposed on the first passivation layer 43, over the transparent electrode 41 and connected with the transparent electrode 41 through the via hole 43H, and a pattern of the light-shield strip 52 over the source electrode 33, the drain electrode 34 and the channel, A cross section after the sixth patterning process is illustrated in FIGS. 13 and 14; the light-shield strip and the bias line are of the same material.

Furthermore, the method of the embodiment may further comprises the following step after step 106:

Step 107: a patterning process is used to form a pattern of the second passivation layer 57 overlaying the base substrate, where the second passivation layer 57 has a signal-transmitting region via hole at the peripheral of the base substrate. For the cross section after the seventh patterning process please refer to FIGS. 15 and 16.

Step 107 is optional, as the invention can still be realized without step 107. Therefore, in an embodiment, the method for fabricating the sensor may only comprises the above steps 101 to 106.

In an embodiment of the invention, the data line 31, the source electrode 33, the drain electrode 34 and the receive electrode 39 are of the same material.

In an embodiment of the invention, the pattern of the active layer 36, the pattern of the ohmic layer 35, the pattern of the source electrode 33 and the drain electrode 34, the pattern of the data line 31 and the pattern of the receive electrode 39 can be formed by using a merely single patterning process, which comprises:

sequentially depositing an active semiconductor layer, an ohmic semiconductor layer and a data line metal layer;

applying a photoresist;

exposing the base substrate using a mask having a light-transmitting portion, a partial-light-transmitting portion and a light-blocking portion, wherein the light-blocking portion of the mask correspondingly forms a region having the receive electrode 39, the data line 31, the drain electrode 34 and the source electrode 33, and the partial-light-transmitting portion of the mask correspondingly forms a region having the channel; the mask used in the step may be embodied as a gray tone mask or half-tone mask, etc.;

developing and removing the photoresist corresponding to the light-transmitting portion;

etching the base substrate to form the pattern of the receive electrode 39, the pattern of the data line 31 and the pattern of the active layer 36;

ashing the base substrate and removing the photoresist corresponding to the partial-light-transmitting portion;

etching the base substrate and removing the photoresist, to form the pattern of the ohmic layer 35 and the pattern of the source electrode 33 and the drain electrode 34, the source electrode 33 and the drain electrode 34 are arranged opposed to each other to form the channel.

Figure 17:
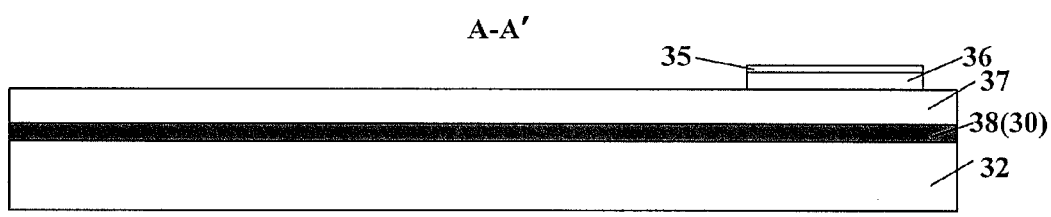
FIG. 17 is a cross section taken along the line A-A' of FIG. 2 after the second patterning process for the sensing element in accordance with another embodiment of the invention.
Figure 18:
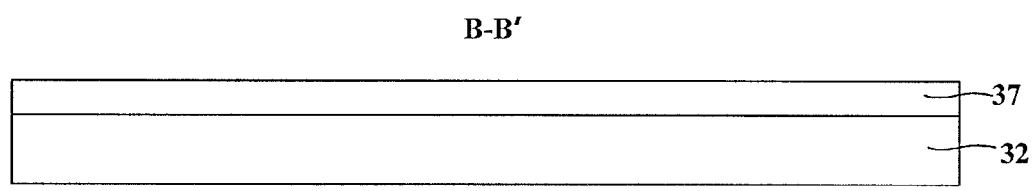
FIG. 18 is a cross section taken along the line B-B' of FIG. 2 after the second patterning process for the sensing element in accordance with another embodiment of the invention.

Furthermore, in another embodiment of the invention, the step 102 may be achieved by using two patterning processes, which comprise:

Step 102*a*, forming the gate insulating layer 37 overlaying the substrate, and then forming a pattern of the active layer 36 over the gate electrode 38 and a pattern of the ohmic layer 35 disposed on the active layer 36 by using a patterning process; a cross section after the patterning process is illustrated in FIGS. 17 and 18.

Step 102*b*, forming a pattern of the source electrode 33 and the drain electrode 34 arranged opposed to each other to form the channel and disposed on the ohmic layer 35, a pattern of the data line 31 connected with the drain electrode 34 and a pattern of a receive electrode 39 connected with the source electrode 33, by using a patterning process. A cross section after the patterning process is illustrated in FIGS. 5 and 6.

It is seen from the above description that, the method for fabricating the sensor of the invention employs seven or eight patterning processes, in comparison with the conventional technology, which reduces the number of mask as well as the production cost and simplifies the production process, thereby significantly improves the production capacity and the defect-free rate.

What are described above is related to the illustrative embodiments of the disclosure only and not limitative to the scope of the disclosure; the scopes of the disclosure are defined by the accompanying claims.

What is claimed is:

1. A method for fabricating a sensor comprising:

forming a pattern of a gate line and a pattern of a gate electrode connected with the gate line on a base substrate by using a first patterning process;

forming a gate insulating layer overlaying the base substrate, and forming a pattern of an active layer on the gate insulating layer and over the gate electrode, a pattern of an ohmic layer on the active layer, a pattern of a source electrode and a drain electrode on the ohmic layer and arranged opposed to each other to form a channel, a pattern of a data line connected with the drain electrode, and a pattern of a receive electrode connected with the source electrode;

forming a pattern of a passivation protective layer on the source electrode, the drain electrode and the channel by using a second patterning process;

forming a pattern of a photodiode on the receive electrode and a pattern of a transparent electrode on the photodiode by using a third patterning process;

forming a pattern of a first passivation layer by using a fourth patterning process, the first passivation layer has a via hole over the transparent electrode;

forming a pattern of a bias line on the first passivation layer and connected with the transparent electrode through the via hole over the transparent electrode, and a pattern of a light-shield strip on the source electrode, the drain electrode and the channel by using a fifth patterning process;

wherein forming the pattern of the active layer, the pattern of the ohmic layer, the pattern of the source electrode and the drain electrode, the pattern of the data line and the pattern of the receive electrode in a same layer by using a single patterning process;

wherein for said single patterning process only one mask is used.

2. The method of claim 1, after forming the pattern of the bias line and the pattern of the light-shield strip, the method further comprises:

forming a pattern of a second passivation layer overlaying the base substrate by using a sixth patterning process.

3. The method of claim 1, wherein the photodiode is a PIN photodiode comprising an N-type semiconductor, an I-type semiconductor and a P-type semiconductor.

4. The method of claim 1, wherein the single patterning process for forming the pattern of the active layer, the pattern of the ohmic layer, the pattern of the source electrode and the drain electrode, the pattern of the data line and the pattern of the receive electrode comprises:

sequentially depositing an active semiconductor layer, an ohmic semiconductor layer and a data line metal layer, and applying a photoresist to the data line metal layer;

exposing the base substrate by using a mask having a light-transmitting portion, a partial-light-transmitting portion and a light-blocking portion;

developing and removing the photoresist corresponding to the light-transmitting portion;

etching the base substrate to form the pattern of the receive electrode, the pattern of the data line and the pattern of the active layer;

ashing the base substrate and removing the photoresist corresponding to the partial-light-transmitting portion;

etching the base substrate and removing the photoresist to form the pattern of the ohmic layer and the pattern of the source electrode and the drain electrode, the source electrode and the drain electrode are arranged opposed to each other to form the channel.

5. The method of claim 4, wherein the light-blocking portion of the mask correspondingly forms a region having the receive electrode, the data line, the source electrode and the drain electrode, and the partial-light-transmitting portion of the mask correspondingly forms a region having the channel.

6. The method of claim 1, wherein the data line, the source electrode, the drain electrode and the receive electrode are of the same material.

7. The method of claim 1, wherein the light-shield strip and the bias line are of the same material.

8. A method for fabricating a sensor comprising:

forming a pattern of a gate line and a pattern of a gate electrode connected with the gate line on a base substrate by using a first patterning process;

forming a gate insulating layer overlaying the base substrate, and forming a pattern of an active layer on the gate insulating layer and over the gate electrode, a pattern of an ohmic layer on the active layer, a pattern of a source electrode and a drain electrode on the ohmic layer and arranged opposed to each other to form a channel, a pattern of a data line connected with the drain electrode, and a pattern of a receive electrode connected with the source electrode;

forming a pattern of a passivation protective layer on the source electrode, the drain electrode and the channel by using a second patterning process;

forming a pattern of a photodiode on the receive electrode and a pattern of a transparent electrode on the photodiode by using a third patterning process;

forming a pattern of a first passivation layer by using a fourth patterning process, the first passivation layer has a via hole over the transparent electrode;

forming a pattern of a bias line on the first passivation layer and connected with the transparent electrode through the via hole over the transparent electrode, and a pattern of a light-shield strip on the source electrode, the drain electrode and the channel by using a fifth patterning process;

wherein forming the pattern of the active layer, the pattern of the ohmic layer, the pattern of the source electrode and the drain electrode, the pattern of the data line and the pattern of the receive electrode in a same layer by using two patterning processes;

wherein for said second patterning process only one mask is used.

9. The method of claim 8, after forming the pattern of the bias line and the pattern of the light-shield strip, the method further comprises:

forming a pattern of a second passivation layer overlaying the base substrate by using a sixth patterning process.

10. The method of claim 9, wherein the photodiode is a PIN photodiode comprising an N-type semiconductor, an I-type semiconductor and a P-type semiconductor.

11. The method of claim 9, wherein the two patterning process for forming the pattern of the active layer, the pattern of the ohmic layer, the pattern of the source electrode and the drain electrode, the pattern of the data line and the pattern of the receive electrode comprises:

forming the pattern of the active layer over the gate electrode and the pattern of the ohmic layer on the active layer by using a patterning process;

forming the pattern of the source electrode and the drain electrode on the ohmic layer and arranged opposed to each other to form a channel, the pattern of the data line connected with the drain electrode and the pattern of the receive electrode connected with the source electrode by using a patterning process.

12. The method of claim 9, wherein the data line, the source electrode, the drain electrode and the receive electrode are of the same material.

13. The method of claim 9, wherein the light-shield strip and the bias line are of the same material.

* * * * *